(12) United States Patent
Weng et al.

(10) Patent No.: US 9,320,143 B2
(45) Date of Patent: Apr. 19, 2016

(54) TOUCH MEMBER AND METHOD OF MANUFACTURING THE SAME

(71) Applicant: UNIMICRON TECHNOLOGY CORP., Taoyuan Hsien (TW)

(72) Inventors: Cheng-Ming Weng, New Taipei (TW); Wei-Ming Cheng, Kaohsiung (TW); Han-Pei Huang, Taoyuan County (TW)

(73) Assignee: Unimicron Technology Corp., Taoyuan Hsien (TW)

( * ) Notice: Subject to any disclaimer, the term of this patent is extended or adjusted under 35 U.S.C. 154(b) by 194 days.

(21) Appl. No.: 13/845,325

(22) Filed: Mar. 18, 2013

(65) Prior Publication Data

US 2014/0151107 A1   Jun. 5, 2014

(30) Foreign Application Priority Data

Dec. 5, 2012   (TW) .............................. 101145641 A

(51) Int. Cl.
*H05K 1/11*   (2006.01)
*H05K 3/42*   (2006.01)
*H05K 3/00*   (2006.01)

(52) U.S. Cl.
CPC .............. *H05K 1/115* (2013.01); *H05K 3/0032* (2013.01); *H05K 3/42* (2013.01); *H05K 3/426* (2013.01); *H05K 2201/09563* (2013.01); *H05K 2201/09709* (2013.01); *H05K 2201/09836* (2013.01); *H05K 2201/09854* (2013.01); *H05K 2203/1476* (2013.01); *H05K 2203/1572* (2013.01); *Y10T 29/49165* (2015.01)

(58) Field of Classification Search
CPC ................... H05K 3/42; H05K 1/115; H05K 2201/09836; H05K 1/111–1/114
See application file for complete search history.

(56) References Cited

U.S. PATENT DOCUMENTS

| 3,217,283 | A | * | 11/1965 | Shlesinger, Jr. ........ H01R 13/33 174/254 |
| 4,593,961 | A | * | 6/1986 | Cosmo ............................ 439/66 |
| 5,378,314 | A | * | 1/1995 | Schmidt ................. H05K 1/115 216/18 |
| 2006/0032670 | A1 | * | 2/2006 | Haba ................. H01L 23/49827 174/267 |
| 2008/0257591 | A1 | * | 10/2008 | Ikeda ............................. 174/255 |
| 2010/0084178 | A1 | * | 4/2010 | Sweeney et al. ............... 174/262 |

FOREIGN PATENT DOCUMENTS

| EP | 1988758 A1 | 11/2008 |
| TW | 200738092 | 10/2007 |

* cited by examiner

*Primary Examiner* — Steven T Sawyer
(74) *Attorney, Agent, or Firm* — Rosenberg, Klein & Lee

(57) ABSTRACT

A wiring board includes a substrate, a first conductor layer, a second conductor layer, and a through-via conductor. The substrate has a first surface, a second surface, and at least one through-via. The first conductor layer is formed on the first surface, and the second conductor layer is formed on the second surface. The through-via conductor is formed in the through-via for electrically connecting to the first conductor layer and the second conductor layer. The through-via has a first depressed portion exposed in the first surface, a second depressed portion exposed in the second surface, and a tunnel portion between the first depressed portion and the second depressed portion for connecting the first depressed portion and the second depressed portion. The first depressed portion and the second depressed, portion are non-coaxial.

15 Claims, 8 Drawing Sheets

TOUCH MEMBER AND METHOD OF MANUFACTURING THE SAME

BACKGROUND

1. Field of the Invention

The instant disclosure relates to an electronic component and method of manufacturing the same; in particular, to a wiring board and method of manufacturing the same.

2. Description of Related Art

Electronic products are widely implemented in the fields of entertainment, communications, power conversion, network, computer and consumer products. Electronic products can also be found in military applications, aviation, automotive, industrial controllers, and office equipment. Today's electronic products are required for miniaturization. In addition to the need to maintain high performance and stable quality, we must also save space in order to achieve the purpose of miniaturization. The demand for elevating the processing speed and reducing the size of the electronic products is also increasing.

In order to meet the requirements of the miniaturization in packaging, the circuit board is also gradually evolved by the double-layer circuit board into a multilayer circuit board, thereby expanding the area of wiring available on the circuit board layout in the limited space of the circuit board through the interlayer connection technology.

SUMMARY OF THE INVENTION

The object of the instant disclosure is to provide a wiring board and a method of manufacturing thereof. The wiring board and the method of manufacturing thereof utilize a through-via conductor formed in a through-via of the substrate to provide electrically connection.

According to one exemplary embodiment of the instant disclosure, a wiring board is provided, which includes a substrate, a first conductor layer, a second conductor layer, and a through-via conductor. The substrate has a first surface and a second surface, and the substrate has at least one through-via passing through the substrate from the first surface to the second surface. The first conductor layer is formed on the first surface, and the second conductor layer is formed on the second surface. The through-via has a first depressed portion exposed in the first surface, a second depressed portion exposed in the second surface, and a tunnel portion between the first depressed portion and the second depressed portion for connecting the first depressed portion and the second depressed portion. The first depressed portion and the second depressed portion are non-coaxial, and an internal diameter of the tunnel portion is less than a diameter of the first depressed portion in the first surface and a diameter of the second depressed portion in the second surface.

According to one exemplary embodiment of the instant disclosure, a method of manufacturing the wiring board is provided, which includes the steps of: firstly, forming at least one through-via passing through an initial substrate from a first surface of a substrate to the second surface of the substrate, in which the through-via has a first depressed portion exposed in the first surface, a second depressed portion exposed in the second surface, and a tunnel portion between the first depressed portion and the second depressed portion for connecting the first depressed portion and the second depressed portion, and the first depressed portion and the second depressed portion are non-coaxial, and an internal diameter of the tunnel portion is less than a diameter of the first depressed portion in the first surface and a diameter of the second depressed portion in the second surface; then, forming a first conductor layer on the first surface; forming a second conductor layer on the second surface; and forming a through-via conductor in the through-via for electrically connecting to the first conductor layer and the second conductor layer.

In summary, by configuring the tunnel portion, the first depressed portion, and the second depressed portion of the through-via, the wiring board and manufacturing method thereof are highly flexible in designing the arrangement of the first conductor layer on the first surface and the arrangement of the second conductor layer on the second surface as well as reliable in interlayer electrically connection.

In order to further understand the instant disclosure, the following embodiments are provided along with illustrations to facilitate the appreciation of the instant disclosure; however, the appended drawings are merely provided for reference and illustration, without any intention to be used for limiting the scope of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

(The Embodiment of a Wiring Board 100 and the Manufacturing Method Thereof).

Figure 1A:
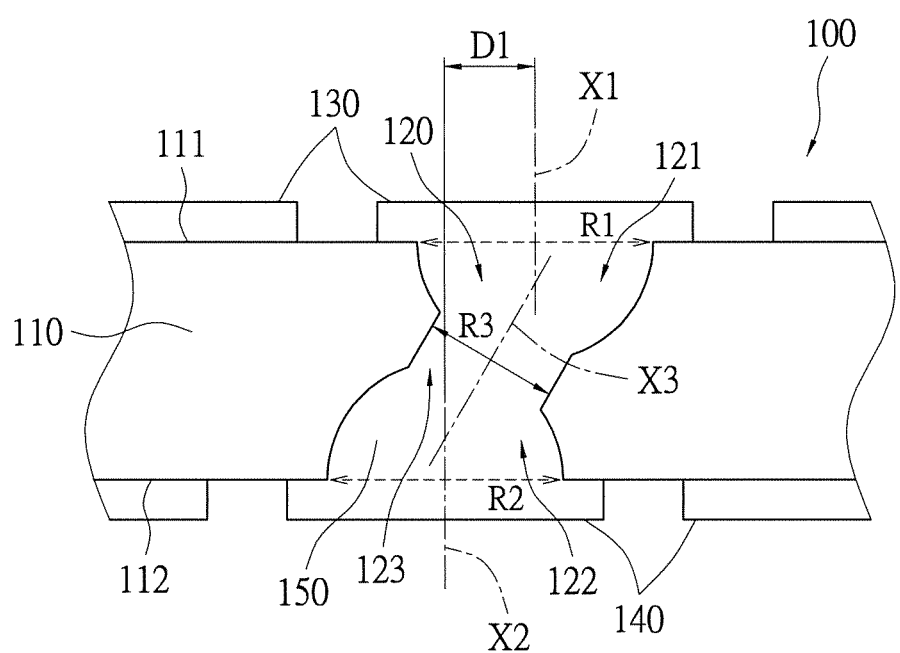
FIG. 1A illustrates a cross-sectional view of a wiring board in accordance with an embodiment of the instant disclosure.

Please refer to FIGS. 1A to 1F. FIG. 1A illustrates a cross-sectional view of a wiring board 100 in accordance with an embodiment of the instant disclosure, as shown in FIG. 1A, the wiring board 100 includes a substrate 110, a first conductor layer 130, a second conductor layer 140, and a through-via conductor 150. FIGS. 1B to 1F are cross-sectional views of a method of manufacturing a wiring board 100 in accordance with FIG. 1A.

Figure 1B:
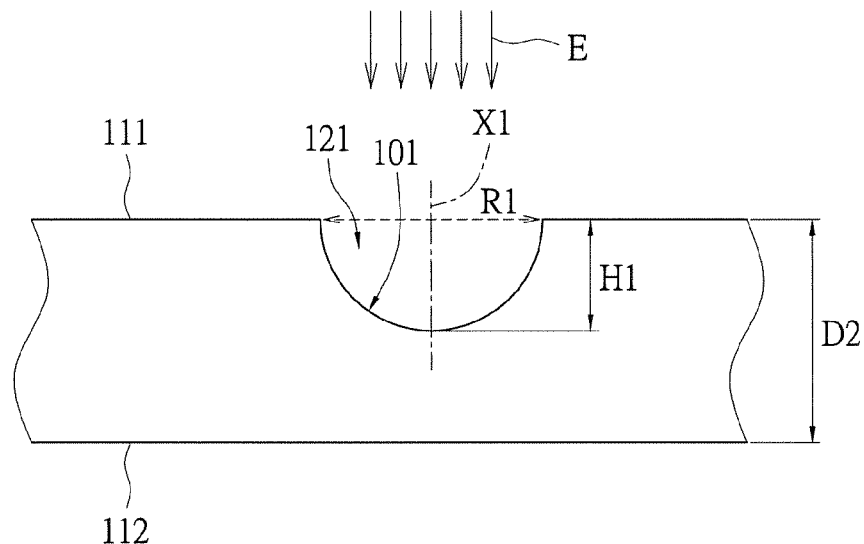
FIGS. 1B to 1F are cross-sectional views of a method of manufacturing a wiring board in accordance with FIG. 1A.
Figure 1C:
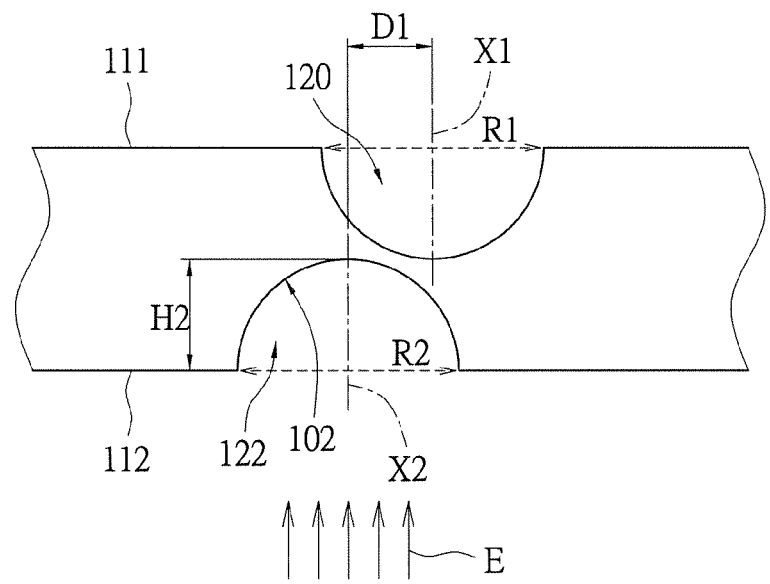
Figure 1D:
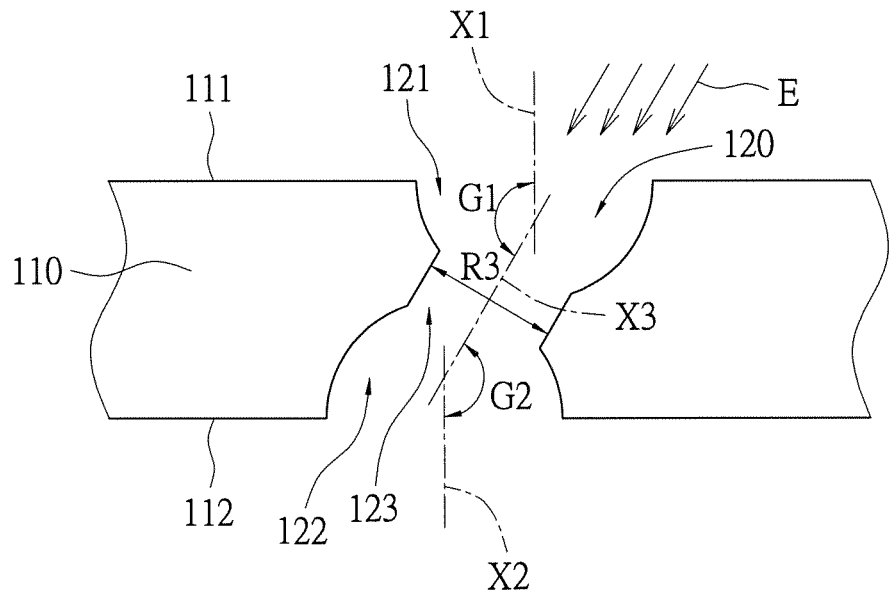
Figure 1E:
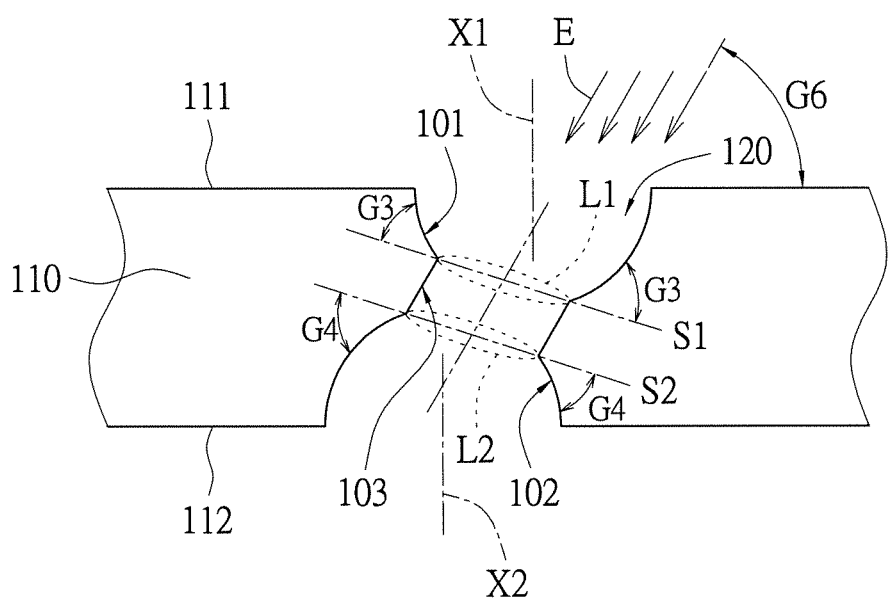

During the manufacturing of the wiring board 100, first of all, to pride an initial substrate, and to form a through-via 120 passing through the initial substrate (as shown in FIGS. 1A, 1D and 1E), thereby a substrate 110 having the through-via 120 is provided. The substrate 110 (or the initial substrate) is electrically insulated and can be made of, for example, epoxy, polyimide, bismaleimide triazine resin or allylated polyphenylene ether resin. In the instant embodiment, the initial substrate can be used as core layer, and insulate layers and conductive layers can be alternately formed on the substrate 110 by build-up process. The initial substrate can be made of fiber reinforced substrate, which contains stiffeners such as hardening resin and glass cloth, glass non-woven or non-woven fabric of aromatic polyamides.

The thickness of the initial is substantially equal to the thickness of the substrate 110, which is the vertical distance D2 between the first surface 111 and the second surface 112. The thickness of the initial substrate ranges from 50 to 200 millimeters (mm), and the preferable thickness ranges from 100 to 150 millimeters (mm). The initial substrate has a first surface 111 and a second surface 112. As shown in FIG. 1B, the first surface 111 can be the upper surface of the initial substrate, and the second surface 112 can be the bottom surface of the initial substrate.

Subsequently, to form the at least one through-via 120 passing through the initial substrate from a first surface 111 of the substrate 110 to a second surface 112 of the substrate 110. The through-via 120 has a first depressed portion 121, a second depressed portion 122, and a tunnel portion 123. Specifically, the first depressed portion 121 is exposed in the first surface 111, while the second depressed portion 122 is exposed in the second surface 112. Furthermore, the first depressed portion 121 and the second depressed portion 122 are non-coaxial. The tunnel portion 123 is between the first depressed portion 121 and the second depressed portion 122 for connecting the first depressed portion 121 and the second depressed portion 122. The first depressed portion 121 has a diameter R1 in the first surface 111, and the second depressed portion 122 has a diameter R2 in the second surface 112. The tunnel portion 123 has an internal diameter R3, which is less than the diameter R1 of the first depressed portion 121 and is less than the diameter R2 of the second depressed portion 122.

The step of forming the through-via 120 passing through the initial substrate of the first embodiment of the instant disclosure is further described hereinafter. As shown in FIG. 1B, the formation of the first depressed portion 121 exposed on the first surface 111 is illustrated. The first surface 111 is concaved to form the first depressed portion 121, that is, the concaved portion of the first surface 111 defines the side wall 101 of the first depressed portion 121. The first depressed portion 121 may be formed by a laser drilling process, in which part of the initial substrate is removed during drilling initial substrate for the formation of the first depressed portion 121. The laser beam can vertically target on the first surface 111, in other words, the incident direction of the laser beam and the first surface 111 intersect to form an angle (i.e. an incident angle), which is substantially 90 degrees. The laser beam used in the laser drilling process can be carbon dioxide laser beam, UV-YAG laser, and the like.

In the instant embodiment, the shape of the first depressed portion 121 is substantially semicircular cone, and the first depressed portion 121 has a first opening, which is substantially circular in shape, in the first surface 111. The side wall 101 of the first depressed portion 121 decreases in diameter from the first surface 111 toward the second surface 112. The diameter R1 of the first depressed portion 121 is for example, in a range of 40 to 80 micrometer. It is worth to note that the first depressed portion 121 has an axis X1 in the FIG. 1B. The axis X1 of the first depressed portion 121 passes through the center point of the first opening in the first surface 111 to define the extension direction of the first depressed portion 121. The first depressed portion 121 has a first depth H1 from the first surface 111, the first depth H1 is the maximum depth of the first depressed portion 121 respect to the first surface 111. The first depth H1 can be in a range of 10 to 100 micrometers.

Please refer to FIG. 1C. The step of forming the through-via 120 passing through the initial substrate includes forming the second depressed portion 122 exposed in the second surface 112. The second surface 112 is concaved to form the second depressed portion 122, that is, the concave portion of the second surface 112 defines the side wall 102 of the second depressed portion 122. The second depressed portion 122 may be formed by laser drilling process, in which part of the initial substrate is removed during drilling initial substrate for the formation of the second depressed portion 122. The laser beam can vertically target on the second surface 112, in other words, the incident direction of the laser beam and the second surface 112 intersect to form an angle (i.e. an incident angle), which is substantially 90 degrees.

In the instant embodiment, the shape of the second depressed portion 122 is similar to the shape of the first depressed portion 121. The shape of the second depressed portion 122 is substantially semicircular cone, and the second depressed portion has a second opening, which is substantially circular in shape, in the second surface 112. The side wall 102 of the second depressed portion 122 decreases in diameter from the second surface 112 toward the first surface 111. The diameter R2 of the second depressed portion 122 is, for example, in a range of 40 to 80 micrometer. The second depressed portion 122 has an axis X2 in the FIG. 1B. The axis X2 of the second depressed portion 122 passes through the center point of the second opening in the second surface 112 to define the extension direction of the second depressed portion 122. The second depressed portion 122 has a second depth H2 from the second surface 112, and the second depth H2 is the maximum depth of the second depressed portion 122 with respect to the second surface 112. The second depth H2 can be in a range of 10 to 100 micrometers.

It is worth to note that the first depressed portion 121 and the second depressed portion 122 are non-coaxial. In other words, the vertical projection of the center point of the first opening on the second plane does not overlap the center point of the second opening. Meanwhile, the vertical projection of the center point of the second opening on the first plane does not overlap the center point of the first opening. For example, in the instant embodiment, the axis X1 of the first depressed portion 121 and the axis X2 the second depressed portion 122 are parallel to each other, such that a distance D1 therebetween is in a range of 5 to 40 micrometer, thereby the first depressed portion 121 and the second depressed portion 122 being offset from each other.

Furthermore, the sum of the first depth H1 and the second depth H2 is not greater than a vertical distance D2, which is measured between the first surface 111 and the second surface 112. For example, the first depth H1 and the second depth H2 are substantially the same, and are equal to half of the vertical distance D2, which is measured between the first surface 111 and the second surface 112.

Please refer to FIGS. 1D and 1E. FIGS. 1D and 1E illustrate cross-sectional views of substantially the same step of the method of manufacturing a wiring board 100 in accordance with FIG. 1A. Subsequently, forming the tunnel portion 123 between the first depressed portion 121 and the second depressed portion 122 for connecting the first depressed portion 121 and the second depressed portion 122. Specifically, part of the initial substrate is removed by targeting the first depressed portion 121 or the second depressed portion 122 with a laser beam, whereby for forming the through-via 120 passing through the initial substrate to provide the substrate 110 having the through-via 120. The incident direction of the laser can slant toward the first surface 111 or the second surface 112 at an angle G6 ranging from 30 to 80 degrees. In the instant embodiment, the incident direction of the laser can slant toward the first surface 111 or the second surface 112 at an angle G6 ranging from 40 to 60 degrees.

The tunnel portion 123 is between the first depressed portion 121 and the second depressed portion 122 for connecting the first depressed portion 121 and the second depressed portion 122. To put it concretely, the tunnel portion 123 is formed in the substrate 110. One end of the tunnel portion 123 can be exposed in the sidewall of the first depressed portion 121, while the other end of the tunnel portion 123 can be exposed in the sidewall of the second depressed portion 122. As shown in FIGS. 1D and 1E, the shape of the tunnel portion 123 is substantially cylindrical, and the internal diameter R3 of the tunnel portion 123 is invariant. It is worth to note that, the internal diameter R of the tunnel portion 123 is less than the diameter R1 in the first surface 111, and is less than the diameter R2 in the second surface 112. Exemplary, the internal diameter R3 of the tunnel portion 123 is in a range from 10 to 70 micrometers.

The tunnel portion 123 has an axis X3, which is not parallel with the axis X1 of the first depressed portion 121 or the axis X2 of the second depressed portion 122. In the instant embodiment, the axis X3 of the tunnel portion 123 and the axis X1 of the first depressed portion 121 intersect to define an angle G1 ranging from 120 to 175 degrees, and the axis X3 of the tunnel portion 123 and the axis X2 of the second depressed portion 122 intersect to define an angle G2 ranging from 120 to 175 degrees.

Moreover, the side wall 101 of the first depressed portion 121 and the side wall 103 of the tunnel portion 123 intersect to define a first neck L1, and the side wall 102 of the second depressed portion 122 and the side wall 103 of the tunnel portion 123 intersect to define a second neck L2. The first neck L1 lies in a first reference plane S1 and the second neck L2 lies in a second reference plane S2. A first angle G3, which is greater than 45 degrees, is formed between the first reference plane S1 and the side wall 101 of the first depressed portion 121. That is, a first tangent plane passing through the first neck L1 portion is tangent to the side wall 101 of the first depressed portion 121, and the first tangent plane slants toward the first reference plane S1 at the first angle G3, which is greater than 45 degrees. A second angle G4, which is greater than 45 degrees, is formed between the second reference plane S2 and the side wall 102 of the second depressed portion122. That is, a second tangent plane passing through the second neck L2 portion is tangent to the side wall 102 of the second depressed portion 122, and the second tangent plane slants toward the second reference plane S2 at the second angle G4, which is greater than 45 degrees. As shown in FIG. 1E, the first angle G3 is in a range of 45 to 90 degrees, and the second angle G4 is in a range of 45 to 90 degrees.

Note that in another embodiment, other means can be used such as plasma etching, chemical etching, mechanical drilling or the like, to remove part of the initial substrate, thereby forming the first depressed portion 121, the second depressed portion 122, or the tunnel portion 123. The size, shape or location of the first depressed portion 121, the second depressed portion 122, and the tunnel portion 123 is not limited thereto.

Figure 1F:
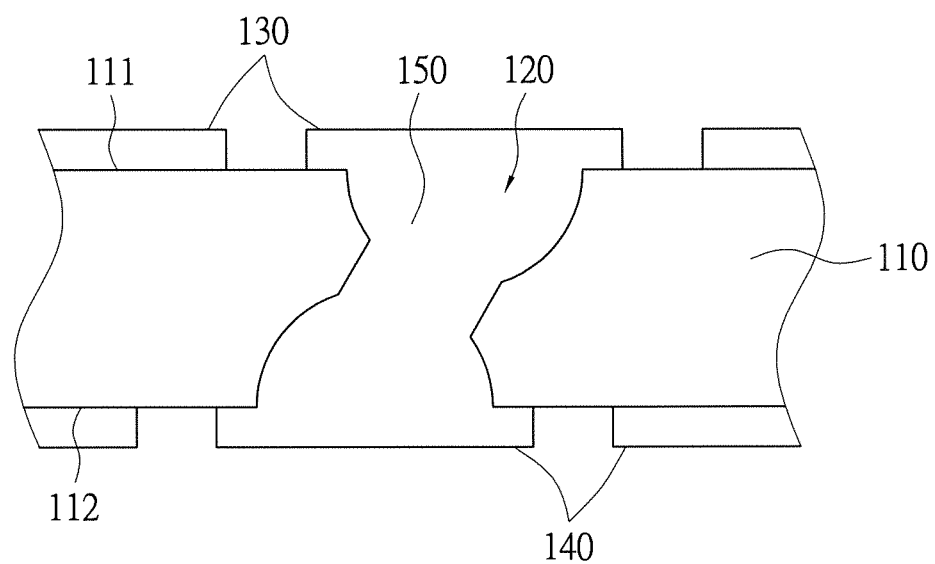

Attention is now invited to FIG. 1F, the first conductor layer 130 is formed on the first surface 111, and the second conductor layer 140 is formed on the second surface 112. Conductive material can coat on the first surface 111 and the second surface 112 by screen printing, electroplating, electroless plating, sputtering or the like to form the first conductor layer 130 and the second conductor layer 140. Exemplary, the steps of forming the first conductor layer 130 and the second conductor layer 140 may include patterning the conductive layer.

In another embodiment, while the conductive layer is patterned, a patterned mask over the first surface 111 or the second surface 112 may be provided. That is, conductive material can be deposited on the first surface 111 or the second surface 112 though the patterned mask to form the first conductor layer 130 and the second conductor layer 140. The mask can be, for example, photoresistant or dry film. The material of the first conductor layer 130 and the second conductor layer 140 can be selected from the group consisting of metal, alloy, conducting polymer and the combinations thereof. The first conductor layer 130 and the second conductor layer 140 may also be multi-layered containing the above-mentioned materials.

Subsequently, the through-via conductor 150 is formed in the through-via 120 for electrically connecting to the first conductor layer 130 and the second conductor layer 140. In the instant embodiment, as shown in FIG. 1F, conductive material can fill into the through-via 120 by plating hole process to form the through-via conductor 150. To put it in concrete, the substrate 110 having the through-via 120 can be immersed in the plating solution to fill the through-via 120 with conductive material. The material of the through-via conductor 150 can be selected from metal, alloy, conducting polymer and the combinations thereof.

In addition, the step of forming the first conductor layer 130, the second conductor layer 140, and the through-via conductor 150 may include first forming an electroless plating layer on the first surface 111, the second surface 112, and the sidewall of the through-via 120 by electroless plating. That is, the plating layer can be formed on the first surface 111, the second surface 112, the sidewall of the first depressed portion 121, the sidewall of the second depressed portion 122, and the sidewall of the tunnel portion 123. Subsequently, an electroplating layer can be formed on the electroless plating layer to fill the through-via 120 with conductive material to form the through-via conductor 150. At the same time, the first conductor layer 130 can be formed on the first surface 111, and the second conductor layer 140 can be formed on the second surface 112.

It is worth to note that, in the step of forming the through-via conductor 150 by the above mentioned plating hole process, the electroless plating layer can be formed in the through-via 120 beforehand in accordance with the design of the first depressed portion 121, the second depressed portion 122, and the tunnel portion 123. To put it concretely, when the conductive material is filling into the through-via 120 by plating hole process, the conductive material can fill the tunnel portion 123 of the through-via 120 first, then fill the rest portion of the through-via 120 (i.e. the first depressed portion 121 and the second depressed portion 122), thereby forming the through-via conductor 150. Consequently, the forming cavities in the through-via 120 may be reduced.

After forming the through-via conductor 150 the wiring board 100 is realized. As shown in FIG. 1A the wiring board 100 in accordance with the first embodiment of the instant disclosure includes the substrate 110, the first conductor layer 130, the second conductor layer 140, and the through-via conductor 150. The substrate 110 has the first surface 111, the second surface 112, and the at least one through-via 120 passing through the substrate 110 from the first surface 111 to the second surface 112. The first conductor layer 130 is formed on the first surface 111, and the second conductor layer 140 is formed on the second surface 112. The through-via conductor 150 is formed in the through-via 120 for electrically connecting to the first conductor layer 130 and the second conductor layer 140. The through-via 120 has the first depressed portion 121, and the second depressed portion 122, and the tunnel portion 123. The first depressed portion 121 is exposed in the first surface 111, and the second depressed portion 122 is exposed in the second surface 112. The first depressed portion 121 and the second depressed portion 122 are non-coaxial. The tunnel portion 123 is between the first depressed portion 121 and the second depressed portion 122 for connecting the first depressed portion 121 and the second depressed portion 122. The internal diameter R3 of the tunnel portion 123 is less than the diameter R1 of the first depressed portion 121 in the first surface 111 and the diameter R2 of the second depressed portion 122 in the second surface 112.

Figure 2:
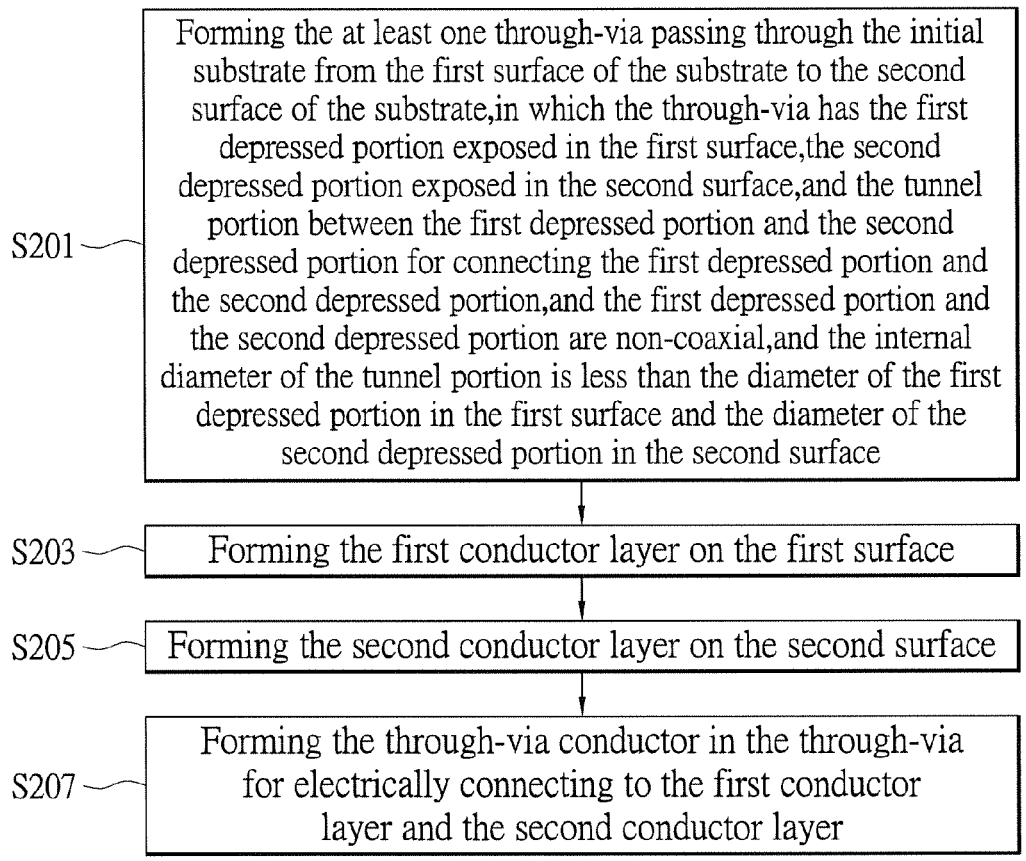
FIG. 2 illustrates a flowchart of a manufacturing method of a wiring board in accordance with an embodiment of the instant disclosure.

Referring to FIG. 2, FIG. 2 illustrates a flowchart of a manufacturing method of a wiring board 100 in accordance with an embodiment of the instant disclosure. The embodiment of the instant disclosure includes the steps of: firstly, forming the at least one through-via 120 passing through the initial substrate from the first surface 111 of the substrate 110 to the second surface 112 of the substrate 110, in which the through-via 120 has the first depressed portion 121 exposed in the first surface 111, the second depressed portion 122 exposed in the second surface 112, and the tunnel portion 123 between the first depressed portion 121 and the second depressed portion 122 for connecting the first depressed portion 121 and the second depressed portion 122, and the first depressed portion 121 and the second depressed portion 122 are non-coaxial, and the internal diameter R3 of the tunnel portion 123 is less than the diameter R1 of the first depressed portion 121 in the first surface 111 and the diameter R2 of the second depressed portion 122 in the second surface 112 (step S201); then, forming the first conductor layer 130 on the first surface 111(step S203); forming the second conductor layer 140 on the second surface 112(step S205); and forming the through-via conductor 150 in the through-via 120 for electrically connecting to the first conductor layer 130 and the second conductor layer 140(step S207).

For different applications, in the step of forming the through-via 120 passing through the initial substrate (step S201) of the above mentioned method may further include: forming the first depressed portion 121 exposed in the first surface 111; forming the second depressed portion 122 exposed in the second surface 112; and forming the tunnel portion 123 between the first depressed portion 121 and the second depressed portion 122 for connecting the first depressed portion 121 and the second depressed portion 122. To put it in concretely, the step of forming the tunnel portion 123 may further include: targeting the first depressed portion 121 or the second depressed portion 122 with a laser beam such that the incident direction of the laser beam slants toward the first surface 111 or the second surface 112.

(Another Embodiment of the Wiring Board 200 System and the Manufacturing Method Thereof.)

Figure 3A:
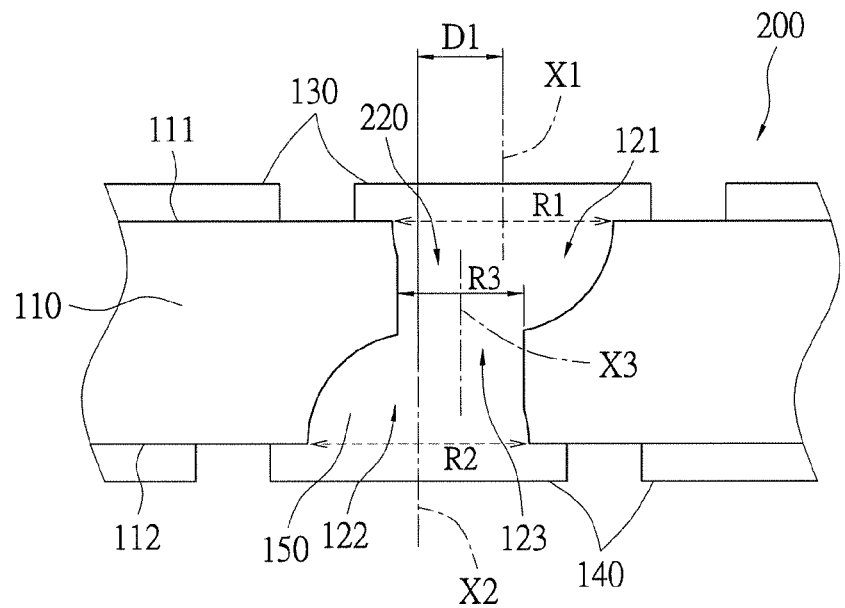
FIG. 3A illustrates a cross-sectional view of a wiring board in accordance with another embodiment of the instant disclosure.
Figure 3B:
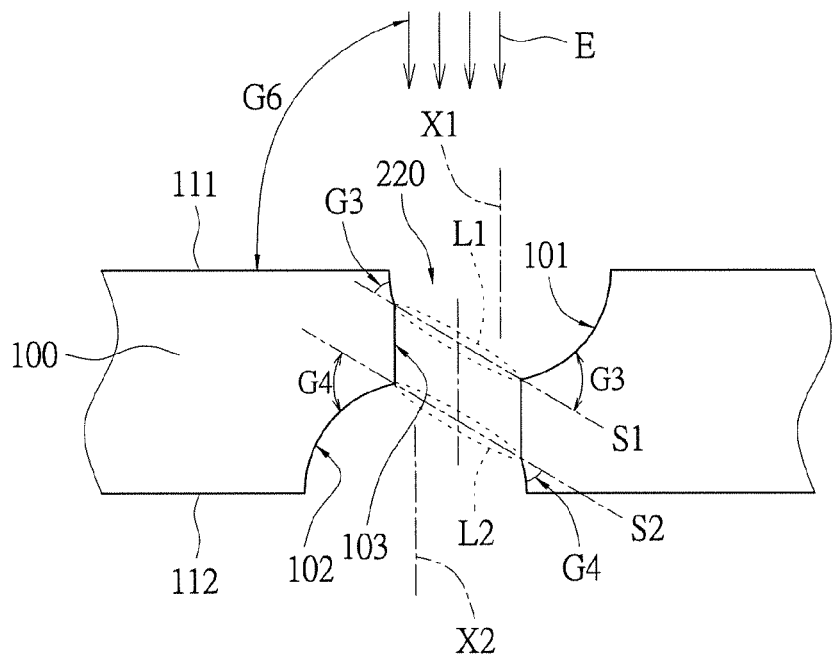
FIG. 3B is a cross-sectional view of a method of manufacturing a wiring board in accordance with FIG. 3A.

Attention is now invited to FIGS. 3A and 3B. FIG. 3A illustrates a cross-sectional view of a wiring board 200 in accordance with another embodiment of the instant disclosure, and FIG. 3B is a cross-sectional view of a method of manufacturing a wiring board 200 in accordance with FIG. 3A. The wiring board 200 and the method of manufacturing the wiring board 200 are similar to the aforementioned wiring board 200 and method, and the description hereinafter further explains the difference there-between. As shown in FIG. 3B, in the instant embodiment, the axes X1, X3 of the first depressed portion 121 and the tunnel portion 123 are parallel to each other, and the axes X 2, X3 of the second depressed portion 122 and the tunnel portion 123 are parallel to each other. To put it in concretely, the tunnel portion 123 of the through-via 220 can be formed in the initial substrate by a laser drilling process, in which part of the initial substrate between the first depressed portion 121 and the second depressed portion 122 is removed during drilling initial substrate with targeting the first depressed portion 121 or the second depressed portion 122 with a laser beam such that the incident direction of the laser beam is perpendicular to the first surface 111 or the second surface 112. In other words, the angle G6 between the incident direction of the laser beam and the first surface 111 or the second surface 112 is about 90 degrees.

In the instant embodiment, the shape of the tunnel portion 123 is substantially cylindrical, and the internal diameter R3 ranges, for example, from 40 to 80 micrometers. The first tangent plane slants toward the first reference plane S1 at a first angle G3, which is greater than 45 degrees. For example, the angel can range from 45 to 90 degrees. The second tangent plane slants toward the second reference plane S2 at a second angle G4, which is greater than 45 degrees. For example, the angel can range from 45 to 90 degrees. The other details as shown in FIG. 1 would not be described here; one having ordinary knowledge in the art can easily understands how to practice this embodiment.

(Another Embodiment of the Wiring Board 300 System and the Manufacturing Method Thereof.)

Figure 4A:
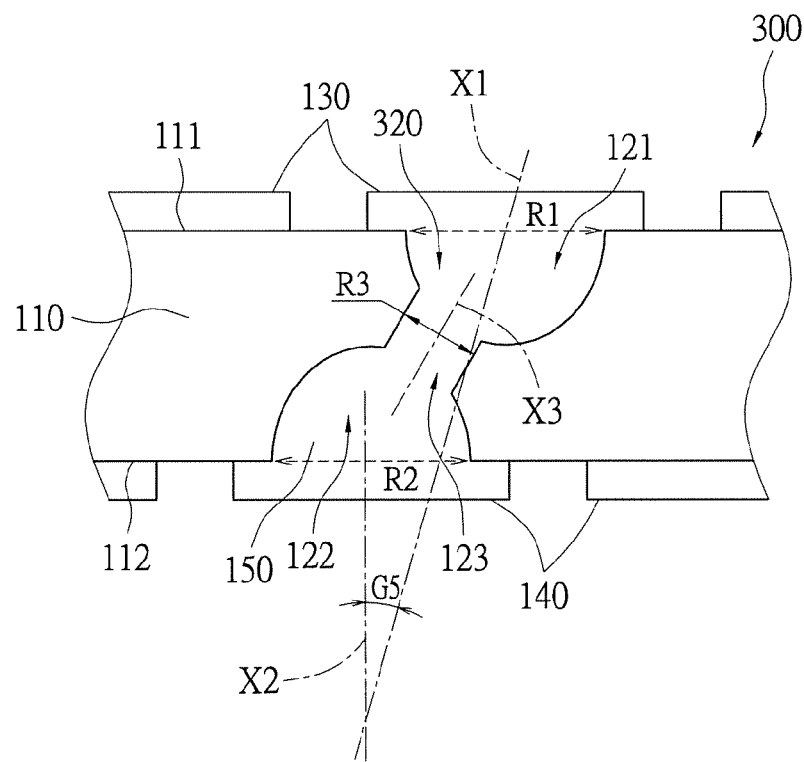
FIG. 4A illustrates a cross-sectional view of a wiring board in accordance with another embodiment of the instant disclosure.
Figure 4B:
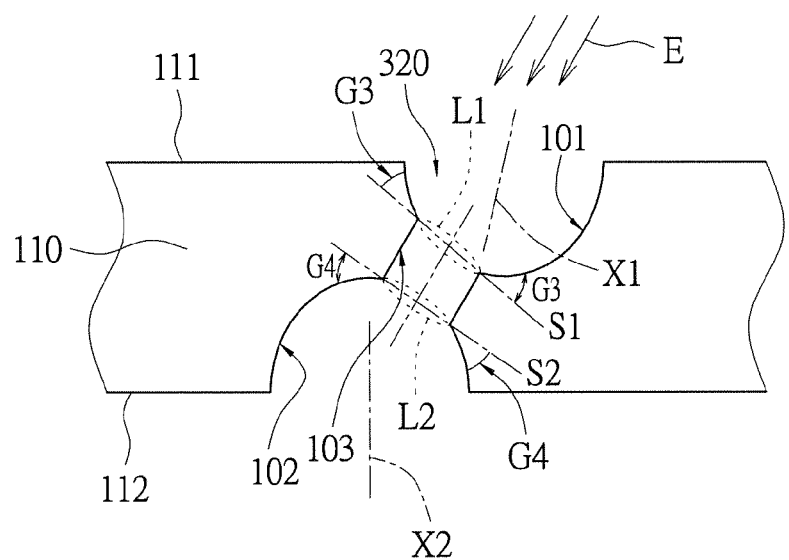
FIG. 4B is a cross-sectional view of a method of manufacturing a wiring board in accordance with FIG. 4A.

Attention is now invited to FIGS. 4A and 4B. FIG. 4A illustrates a cross-sectional view of a wiring board 300 in accordance with another embodiment of the instant disclosure, and FIG. 4B is a cross-sectional view of a method of manufacturing a wiring board 300 in accordance with FIG. 4A. The wiring board 300 and the method of manufacturing the wiring board 300 are similar to the aforementioned wiring board 300 and method, and the description hereinafter further explains the difference there-between. As shown in FIG. 4B, in the instant embodiment, the axes X1, X2 of the first depressed portion 121 and the second depressed portion 122 slant toward each other at an angle G5, which is in a range of 5 to 70 degree. For example, the first depressed portion 121 can be formed by a laser drilling process, in which part of the initial substrate is removed during drilling initial substrate with targeting the first surface 111 such that the incident direction of the laser beam slants toward to the first surface 111. The second depressed portion 122 can be formed by a laser drilling process, in which part of the initial substrate is removed during drilling initial substrate with targeting the second surface 112 with a laser beam such that the incident direction of the laser beam is perpendicular to the second surface 112. In other words, the angle between the incident direction of the laser beam and the second surface 112 is about 90 degrees.

Subsequently, a laser drilling process can be carried out, in which part of the initial substrate between the first depressed portion 121 and the second depressed portion 122 is removed during drilling initial substrate, thereby forming the tunnel portion 123 of the through-via 320, with targeting the first depressed portion 121 or the second depressed portion 122 with a laser beam such that the incident direction of the laser beam slants toward the first surface 111 or the second surface 112. In the instant embodiment, the shape of the tunnel portion 123 is substantially cylindrical, and the internal diameter R3 arranges, for example, ranges from 10 to 70 micrometers. The first tangent plane slants toward the first reference plane S1 at a first angle G3 which is greater than 45 degrees. For example, the angel can range from 45 to 90 degrees. The second tangent plane slants toward the second reference plane S2 at a second angle G4, which is greater than 45 degrees. For example, the angel can range from 45 to 90 degrees. The other details as shown in FIG. 1 would not be described here; one having ordinary knowledge in the art can easily understands how to practice this embodiment.

(Another Embodiment of the Wiring Board 400 System and the Manufacturing Method Thereof.)

Figure 5A:
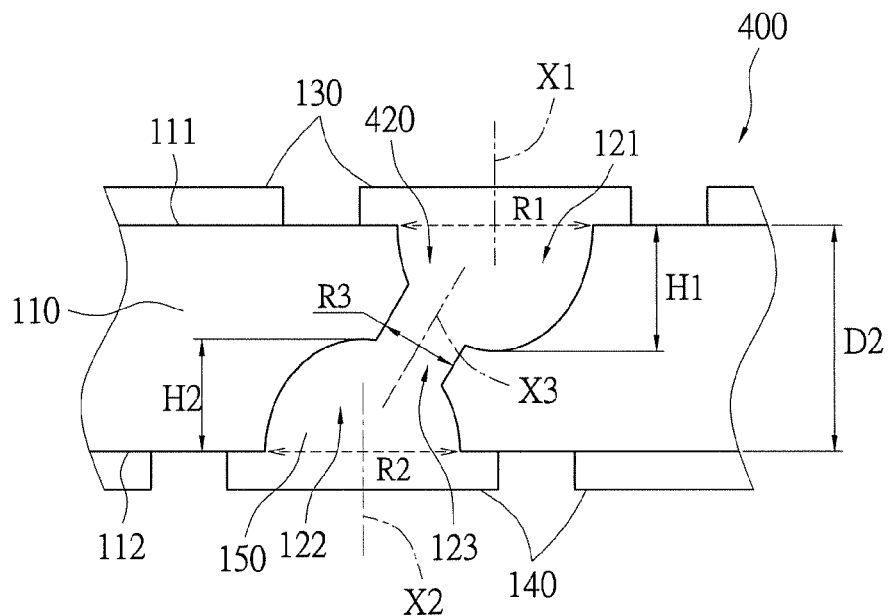
FIG. 5A illustrates a cross-sectional view of a wiring board in accordance with another embodiment of the instant disclosure.
Figure 5B:
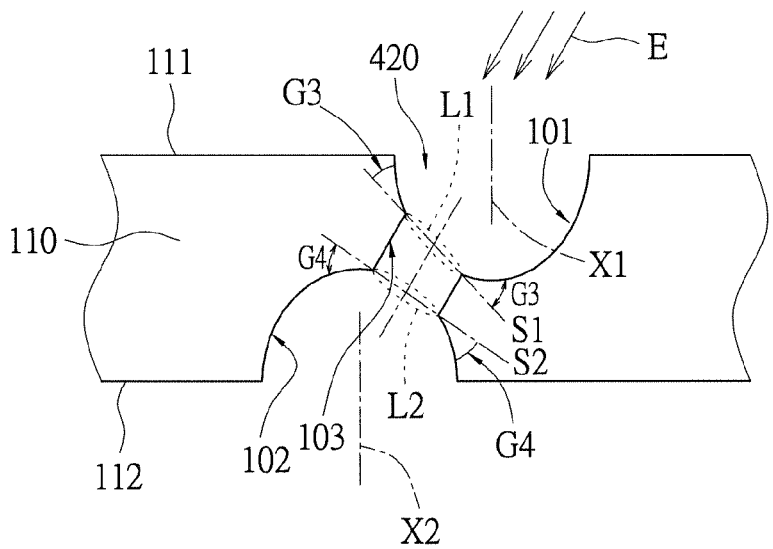
FIG. 5B is a cross-sectional view of a method of manufacturing a wiring board in accordance with FIG. 5A.

Attention is now invited to FIGS. 5A and 5B. FIG. 5A illustrates a cross-sectional view of a wiring board 400 in accordance with another embodiment of the instant disclosure, and FIG. 5B is a cross-sectional view of a method of manufacturing a wiring board 400 in accordance with FIG. 5A. The wiring board 400 and the method of manufacturing the wiring board 400 are similar to the aforementioned wiring board 400 and method, and the description hereinafter further explains the difference there-between. As shown in FIG. 5B, the first depressed portion 121 of the through-via 420 has the first depth H1 from the first surface 111, and the second depressed portion 122 of the through-via 420 has the second depth H2 from the second surface 112, wherein the sum of the first depth H1 and the second depth H2 is greater than the vertical distance D2 measured between the first surface 111 and the second surface 112. For example, the second depth H2 is greater than half of the vertical distance D2 measured between the first surface 111 and the second surface 112, and the first depth H1 is greater than the second depth H2.

In the instant embodiment, the shape of the tunnel portion 123 of the through-via 420 is substantially cylindrical, and the internal diameter R3 ranges, for example, from 10 to 70 micrometers. The first tangent plane slants toward the first reference plane S1 at a first angle G3 which is greater than 45 degrees. For example, the angel can range from 45 to 90 degrees. The second tangent plane slants toward the second reference plane S2 at a second angle G4, which is greater than 45 degrees. For example, the angel can range from 45 to 90 degrees. The other details as shown in FIG. 1 would not be described here; one having ordinary knowledge in the art can easily understands how to practice this embodiment.

According to the embodiments, a wiring board 100, 200, 300, 400 and manufacturing method thereof are provided in the embodiments of the instant disclosure. The wiring board 100, 200, 300, 400 has the through-via conductor 150 formed in the through-via 120 220, 320, 420 to electrically connect the first conductor layer 130 and the second conductor layer 140, whereby the wiring path distance between the first surface 111 and the second surface 112 can be decreased.

According to the embodiments, by configuring the tunnel portion 123, the first depressed portion 121, and the second depressed portion 122 of the through-via 120 220, 320, 420 of the wiring board 100, 200, 300, 400 and manufacturing method thereof in the embodiments, the location where the through-via 120 220, 320, 420 is exposed in the first surface 111 and the location where the through-via 120 220, 320, 420 is exposed in the second surface 112 are off set from each other to allow the flexibility in designing the arrangement of the first conductor layer 130 on the first surface 111 and the arrangement of the second conductor layer 140 on the second surface 112. Hence the wiring hoard 100, 200, 300, 400 is flexible and highly applicable to various applications.

Furthermore, by configuring the tunnel portion 123, the first depressed portion 121, the chances of the formation cavity in the through-via conductor 150 can be reduced. Hence, the yield rate is promoted at the same time The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A wiring board comprising:
   a substrate having opposing first and second surfaces, the substrate having at least one through-via passing through the substrate from the first surface to the second surface;
   a first conductor layer formed on the first surface;
   a second conductor layer formed on the second surface; and
   a through-via conductor formed in the through-via for electrically connecting to the first conductor layer and the second conductor layer;
   wherein the through-via has a first depressed portion exposed in the first surface, a second depressed portion exposed in the second surface, and a cylindrical tunnel portion having a substantially constant internal diameter between the first depressed portion and the second depressed portion for connecting the first depressed portion and the second depressed portion,
   wherein the first depressed portion and the second depressed portion are non-coaxial, and the internal diameter of the tunnel portion is less than a diameter of the first depressed portion in the first surface and a diameter of the second depressed portion in the second surface;
   wherein a bore axis of the first depressed portion and a bore axis of the second depressed portion slant toward each other at an angle, which is in a range of 5 to 70 degrees, said bore axis of the second depressed portion is substantially perpendicular to said second surface of said substrate; and
   wherein the first depressed portion has a first opening in the first surface, the second depressed portion has a second opening in the second surface, and a vertical projection of a center point of the first opening on the second surface and a center point of the second opening are offset from each other by a distance in a range of 5 micrometer to 40 micrometers.

2. The wiring board according to claim 1, wherein in a side wall of the first depressed portion and a side wall of the tunnel portion intersect to define a first neck portion that lies in a first reference plane, a side wall of the second depressed portion and the side wall of the tunnel portion intersect to define a second neck portion that lies in a second reference plane,
   wherein a first angle, which is greater than 45 degrees, is formed between the first reference plane and the side wall of the first depressed portion, and a second angle, which is greater than 45 degrees, is formed between the second reference plane and the side wall of the second depressed portion.

3. The wiring board according to claim 1, wherein axes of the first depressed portion and the tunnel portion are not parallel to each other, and axes of the second depressed portion and the tunnel portion are not parallel to each other.

4. The wiring board according to claim 1, wherein the side wall of the first depressed portion decreases in diameter from the first surface toward the second surface, while the side wall of the second depressed portion decreases in diameter from the second surface toward the first surface.

5. The wiring board according to claim 1, wherein the first depressed portion has a first depth from the first surface, the second depressed portion has a second depth from the second surface, wherein the sum of the first depth and the second depth is not greater than a vertical distance, which is measured between the first surface and the second surface.

6. The wiring board according to claim 1, wherein the first depressed portion has a first depth from the first surface, the second depressed portion has a second depth, which is not equal to the first depth, from the second surface, wherein the sum of the first depth and the second depth is greater than a vertical distance, which is measured between the first surface and the second surface.

7. A method of manufacturing wiring board comprising:
forming at least one through-via passing through an initial substrate from a first surface of the substrate to an opposing second surface of the substrate, wherein the through-via has a first depressed portion exposed in the first surface, a second depressed portion exposed in the second surface, and a cylindrical tunnel portion between the first depressed portion and the second depressed portion for connecting the first depressed portion and the second depressed portion, wherein the first depressed portion and the second depressed portion are non-coaxial, the first and second depressed portions being formed with corresponding first and second bore axes slanting toward each other at an angle in a range of 5 to 70 degrees, the bore axis of the second depressed portion is substantially perpendicular to the second surface of the substrate, and an internal diameter of the tunnel portion is of substantially constant diameter and less than a diameter of the first depressed portion in the first surface and a diameter of the second depressed portion in the second surface, the first depressed portion being formed with a first opening in the first surface, the second depressed portion being formed with a second opening in the second surface, wherein a vertical projection of a center point of the first opening on the second surface and a center point of the second opening are offset from each other by a distance in a range of 5 micrometer to 40 micrometers;
forming a first conductor layer on the first surface;
forming a second conductor layer on the second surface; and
forming a through-via conductor in the through-via for electrically connecting to the first conductor layer and the second conductor layer.

8. The method of manufacturing wiring board according to claim 7, wherein in the step of forming the through-via passing through an initial substrate further includes:
forming the first depressed portion exposed in the first surface;
forming the second depressed portion exposed in the second surface; and
forming the tunnel portion between the first depressed portion and the second depressed portion for connecting the first depressed portion and the second depressed portion.

9. The method of manufacturing wiring board according to claim 8, wherein in the step of forming the tunnel portion further includes:
targeting the first depressed portion or the second depressed portion with a laser beam such that the incident direction of the laser beam slants toward the first surface or the second surface.

10. The method of manufacturing wiring board according to claim 7, wherein a side wall of the first depressed portion and a side wall of the tunnel portion intersect to define a first neck portion that lies in a first reference plane, a side wall of the second depressed portion and the side wall of the tunnel portion intersect to define a second neck portion that lies in a second reference plane,
wherein a first angle, which is greater than 45 degrees, is formed between the first reference plane and the side wall of the first depressed portion, and a second angle, which is greater than 45 degrees, is formed between the second reference plane and the side wall of the second depressed portion.

11. The method of manufacturing wiring board according to claim 8, wherein a side wall of the first depressed portion and a side wall of the tunnel portion intersect to define a first neck portion that lies in a first reference plane, a side wall of the second depressed portion and the side wall of the tunnel portion intersect to define a second neck portion that lies in a second reference plane,
wherein a first angle, which is greater than 45 degrees, is formed between the first reference plane and the side wall of the first depressed portion, and a second angle, which is greater than 45 degrees, is formed between the second reference plane and the side wall of the second depressed portion.

12. The method of manufacturing wiring board according to claim 9, wherein a side wall of the first depressed portion and a side wall of the tunnel portion intersect to define a first neck portion that lies in a first reference plane, a side wall of the second depressed portion and the side wall of the tunnel portion intersect to define a second neck portion that lies in a second reference plane,
wherein a first angle, which is greater than 45 degrees, is formed between the first reference plane and the side wall of the first depressed portion, and a second angle, which is greater than 45 degrees, is formed between the second reference plane and the side wall of the second depressed portion.

13. The method of manufacturing wiring board according to claim 7, wherein the side wall of the first depressed portion decreases in diameter from the first surface toward the second surface, while the side wall of the second depressed portion decreases in diameter from the second surface toward the first surface.

14. The method of manufacturing wiring board according to claim 7, wherein the first depressed portion has a first depth from the first surface, the second depressed portion has a second depth from the second surface, wherein the sum of the first depth and the second depth is not greater than a vertical distance, which is measured between the first surface and the second surface.

15. The method of manufacturing wiring board according to claim 7, wherein the first depressed portion has a first depth from the first surface, the second depressed portion has a second depth, which is not equal to the first depth, from the second surface, wherein the sum of the first depth and the second depth is greater than a vertical distance, which is measured between the first surface and the second surface.

* * * * *